United States Patent
Hayama et al.

(10) Patent No.: US 6,807,066 B2
(45) Date of Patent: Oct. 19, 2004

(54) POWER SUPPLY TERMINAL AND BACK BOARD

(75) Inventors: Junichi Hayama, Kawasaki (JP); Noburo Nakama, Kawasaki (JP); Tetsuya Murayama, Kawasaki (JP); Kenji Tsutsumi, Kawasaki (JP); Satoshi Tojo, Osaka (JP); Hiroshi Kadoya, Kawasaki (JP); Kiyonori Kusuda, Kawasaki (JP); Kenji Toshimitsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/319,926

(22) Filed: Dec. 12, 2002

(65) Prior Publication Data

US 2003/0089514 A1 May 15, 2003

Related U.S. Application Data

(63) Continuation of application No. PCT/JP00/04023, filed on Jun. 20, 2000.

(51) Int. Cl.⁷ ................................................ H05K 7/10
(52) U.S. Cl. ..................... 361/788; 439/69; 439/620; 439/941; 439/947
(58) Field of Search ..................... 439/69, 620, 709, 439/715, 716, 941, 947; 361/816, 818, 823, 824, 788

(56) References Cited

U.S. PATENT DOCUMENTS

| | | | | |
|---|---|---|---|---|
| 4,158,220 A | | 6/1979 | Yamamoto et al. | |
| 4,356,532 A | * | 10/1982 | Donaher et al. | ............ 361/734 |
| 4,519,658 A | * | 5/1985 | Biswas | .......................... 439/68 |
| 4,726,638 A | | 2/1988 | Farrar et al. | |
| 4,931,754 A | * | 6/1990 | Moussie | ..................... 333/184 |
| 5,415,569 A | * | 5/1995 | Colleran et al. | ............ 439/620 |
| 5,480,328 A | * | 1/1996 | Roth et al. | ................... 439/607 |
| 5,509,825 A | * | 4/1996 | Reider et al. | ............... 439/620 |
| 5,513,076 A | * | 4/1996 | Werther | ....................... 361/784 |
| 5,823,826 A | * | 10/1998 | Ward et al. | ................. 439/620 |
| 5,984,725 A | * | 11/1999 | Belopolsky et al. | ........ 439/607 |
| 6,168,474 B1 | * | 1/2001 | German et al. | ............. 439/676 |
| 6,413,119 B1 | * | 7/2002 | Gabrisko et al. | ........... 439/620 |
| 2001/0034165 A1 | * | 10/2001 | Landis et al. | ................ 439/716 |

FOREIGN PATENT DOCUMENTS

| | | |
|---|---|---|
| EP | 0 211 508 | 2/1987 |
| JP | 55-22660 | 2/1980 |
| JP | 58-44676 | 3/1983 |
| JP | 59-105787 U | 6/1984 |
| JP | 60-48521 | 3/1985 |
| JP | 61-4376 | 1/1986 |
| JP | 61-092174 | 5/1986 |
| JP | 63-37581 | 2/1988 |
| JP | 63-118299 | 7/1988 |
| JP | 64-30184 | 2/1989 |
| JP | 4-82181 | 3/1992 |
| JP | 4-162557 | 6/1992 |
| JP | 5-290903 | 11/1993 |
| JP | 6-302714 | 10/1994 |
| JP | 7-22764 | 1/1995 |
| JP | 9-223878 | 8/1997 |

* cited by examiner

*Primary Examiner*—John B. Vigushin
(74) *Attorney, Agent, or Firm*—Katten Muchin Zavis Rosenman

(57) ABSTRACT

A power supply terminal that prevents damage to capacitors included in a noise filter circuit therein which may occur due to a BWB's warp or thermal stresses at soldering time. The noise filter circuit is formed on a noise filter circuit substrate, being a substrate separate from the BWB. The noise filter circuit substrate is connected conductively to part of each of press fit terminals.

13 Claims, 11 Drawing Sheets

POWER SUPPLY TERMINAL AND BACK BOARD

This application is a continuing application, filed under 35 U.S.C. § 111(a), of International Application PCT/JP00/ 04023, filed Jun. 20, 2000.

BACKGROUND OF THE INVENTION (1) Field of the Invention

This invention relates to a power supply terminal for supplying power to a back wiring board (BWB) and a back board for supplying power and, more particularly, to a power supply terminal with a noise filter circuit and a back board with a noise filter circuit.

(2) Description of the Related Art

With the progress and development of various communication systems, such as cellular telephones and the Internet, in various forms, the amount of information they process is increasing steadily in various forms. In the circumstances, there is a tendency to demand of various communication systems higher information density, larger transmission capacity of information, and higher-level functions. To satisfy these demands, consumption of power by each of communication units included in various communication systems has increased and it has been required to have a structure which can withstand a powerful electric current. And furthermore, to process high-density and high-frequency signals, the structure of a BWB included in each communication unit is getting more multilayered steadily and its thickness also tends to increase.

Usually power supply terminals are connected to BWBs included in these communication units by the use of press fit terminals without soldering.

FIG. 10 is a perspective view showing a conventional structure in which power supply is connected to a BWB 151 by the use of a power supply terminal 100 with press fit terminals 121. FIG. 11 is a sectional view taken along the line D—D of FIG. 10.

The power supply terminal 100 includes pressure connection terminals 123 for supplying power, press fit terminals 121 inserted into the BWB 151, and a terminal body 120 where part of each press fit terminal 121 is housed. The pressure connection terminals 123 are electrically connected to the press fit terminals 121 by pressure connection terminal fixing screws 124.

The power supply terminal 100 is inserted into the BWB 151 from one side of the BWB 151. Capacitors 111 included in a noise filter circuit are mounted on the other side of the BWB 151.

A back panel 152 is located on the pressure connection terminal 123 side of the terminal body 120 and the sides of the terminal body 120 and portions around them are covered with a shield 140. The shield 140 is fixed onto the BWB 151 with screws 131a and 131b and are fixed onto the back panel 152 with screws 131c and 131d.

Under the conventional method, however, capacitors included in a noise filter circuit are mounted directly on a BWB. Moreover, this BWB may warp. In such a case, a capacitor included in this noise filter circuit will be damaged when press fit terminals are inserted into or pulled out of the BWB, when packages are inserted into or pulled out of connectors mounted on the BWB, or when the BWB is fitted on an enclosure for a unit.

Furthermore, parts, such as connectors, which cannot withstand reflow soldering are mounted on a BWB. Efficiency in work performed to mount parts on a BWB must also be considered. As a result, capacitors included in a noise filter circuit will be mounted on a BWB by manual soldering with a soldering iron. Therefore, a capacitor included in this noise filter circuit may also be damaged by thermal stresses at this soldering time.

Moreover, if high-frequency capacitors are used in a noise filter circuit, these high-frequency capacitors in the noise filter circuit must be mounted nearby press fit terminals to fully show their noise filter characteristics. However, mounting high-frequency capacitors nearby press fit terminals by manual soldering involves very difficult work. Practically, this means that high-frequency capacitors cannot be used in a noise filter circuit.

In addition, with conventional power supply terminals press fit terminals are inserted into a BWB from one side of the BWB and capacitors included in a noise filter circuit are mounted on the other side of the BWB. Therefore, a shield cannot be fixed with a screw at a position on a BWB where a noise filter circuit is formed. As a result, a shield cannot be located near press fit terminals.

SUMMARY OF THE INVENTION

The present invention was made under the background circumstances as described above. An object of the present invention is to provide a power supply terminal which can prevent damage to a capacitor included in a noise filter circuit due to a BWB's warp or thermal stresses at soldering time.

Another object of the present invention is to provide a power supply terminal which makes it possible to use high-frequency capacitors in a noise filter circuit.

Still another object of the present invention is to provide a power supply terminal which makes it possible to locate a shield near press fit terminals.

In order to achieve the above objects, a power supply terminal for supplying power to a back wiring board is provided. This power supply terminal comprises a terminal body as a base, press fit terminals at least part of each of which is housed in the terminal body and which are electrically connected to the back wiring board by being inserted into the back wiring board, and a noise filter circuit substrate which is separate from the back wiring board and on which capacitors included in a noise filter circuit electrically connected to the press fit terminals are mounted.

Furthermore, according to the present invention, a back board for supplying power is provided. This back board comprises a back wiring board on which a pattern for supplying power is formed, a power supply terminal including a terminal body as a base and press fit terminals at least part of each of which is housed in the terminal body and which are electrically connected to the back wiring board by being inserted into the back wiring board, and a noise filter circuit substrate which is separate from the back wiring board and on which capacitors included in a noise filter circuit electrically connected to the press fit terminals are mounted.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

In the first place, a first embodiment of the present invention will be described.

Figure 1:
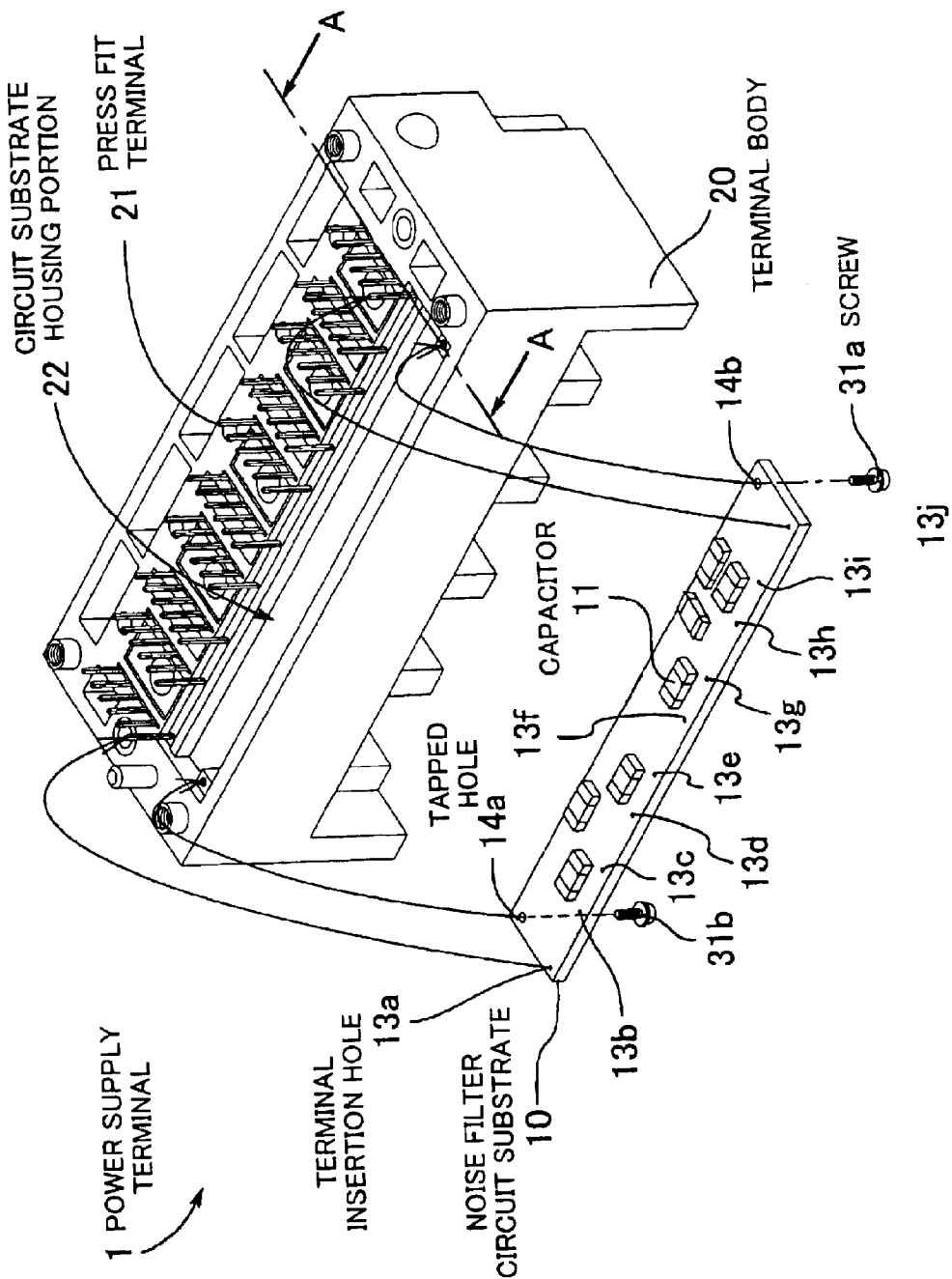
FIG. 1 is a perspective view showing the basic structure of a power supply terminal.
Figure 2:
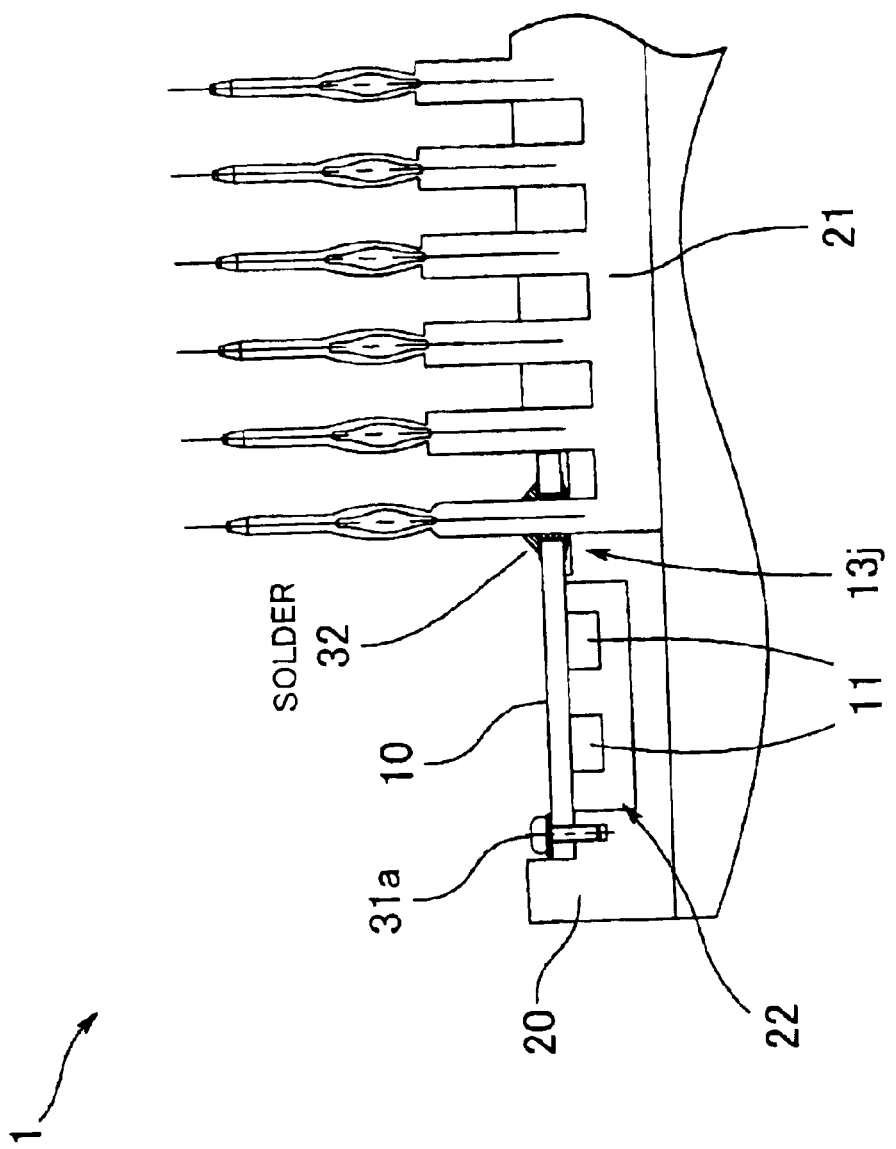
FIG. 2 is a sectional view taken along the line A—A of FIG. 1.

FIG. 1 is a perspective view showing the basic structure of a power supply terminal 1 according to the first embodiment. FIG. 2 is a sectional view taken along the line A—A of FIG. 1.

The basic structure of the power supply terminal 1 according to the first embodiment includes a terminal body 20 as a base, press fit terminals 21 at least part of each of which is housed in the terminal body 20 and which are electrically connected to a back wiring board (BWB) by being inserted into the BWB, a noise filter circuit substrate 10 which is separate from the BWB and on which capacitors 11 included in a noise filter circuit electrically connected to the press fit terminals 21 are mounted, and screws 31a and 31b for fixing the noise filter circuit substrate 10 on the terminal body 20.

Each press fit terminal 21 is formed by bending a conductive plate into a U shape and by locating pins formed like the teeth of a comb between both ends of the plate which have got parallel to each other as a result of the bending. The pin portion of each press fit terminal 21 has elliptical spring portions. Each press fit terminal 21 inserted into the BWB will be fixed to the BWB by spring pressure in these spring portions. Substances, such as phosphor bronze plated with nickel, having high conductivity and moderate mechanical strength could be used as materials for the press fit terminals 21. There are no other special restrictions on materials for the press fit terminals 21.

The terminal body 20 is an insulator close to a rectangular parallelepiped in shape. A circuit substrate housing portion 22, being a slot, where the noise filter circuit substrate 10 is housed is formed in the top of the terminal body 20. Openings where the pin portions of the press fit terminals 21 are inserted when the press fit terminals 21 are fitted are formed next to the circuit substrate housing portion 22. Substances, such as polybutylene terephthalate (PBT), which are insulators and which can be fabricated easily could be used as materials for the terminal body 20. There are no other special restrictions on materials for the terminal body 20.

The noise filter circuit substrate 10 is a rectangular plate of a glass epoxy or the like. A plurality of capacitors 11 included in the noise filter circuit are mounted on the surface of the noise filter circuit substrate 10. In this case, the plurality of capacitors 11 may be mounted by the following reflow soldering. A circuit pattern is formed on a circuit substrate. Then positions on the circuit substrate where the capacitors 11 are to be mounted are coated selectively with a soldering paste by screen printing or the like. And then the capacitors 11 are located at these positions and are heated in a reflow furnace for soldering. A plurality of terminal insertion holes 13a through 13j which pierce through the noise filter circuit substrate 10 are made at the edge portion along one long side of the noise filter circuit substrate 10. Tapped holes 14a and 14b are made at both ends of the edge portion along the other long side of the noise filter circuit substrate 10.

A plurality of press fit terminals 21 are fitted on the terminal body 20. In this case, a portion of each press fit terminal 21 bent into a U shape is housed in the terminal body 20 and a pin portion of each press fit terminal 21 faces upward from the terminal body 20. Moreover, as shown in FIG. 2, the noise filter circuit substrate 10 is located inside the circuit substrate housing portion 22 of the terminal body 20 so that the surface on which the capacitors 11 are mounted will face in the direction of the bottom of the terminal body 20. The noise filter circuit substrate 10 is fixed on the terminal body 20 with the screws 31a and 31b in this state. In this case, pins on the press fit terminals 21 nearest the circuit substrate housing portion 22 are inserted into the terminal insertion holes 13a through 13j in the noise filter circuit substrate 10 from the surface on which the capacitors 11 are mounted. These pins are connected conductively to the noise filter circuit on the noise filter circuit substrate 10 by solder 32.

Figure 3:
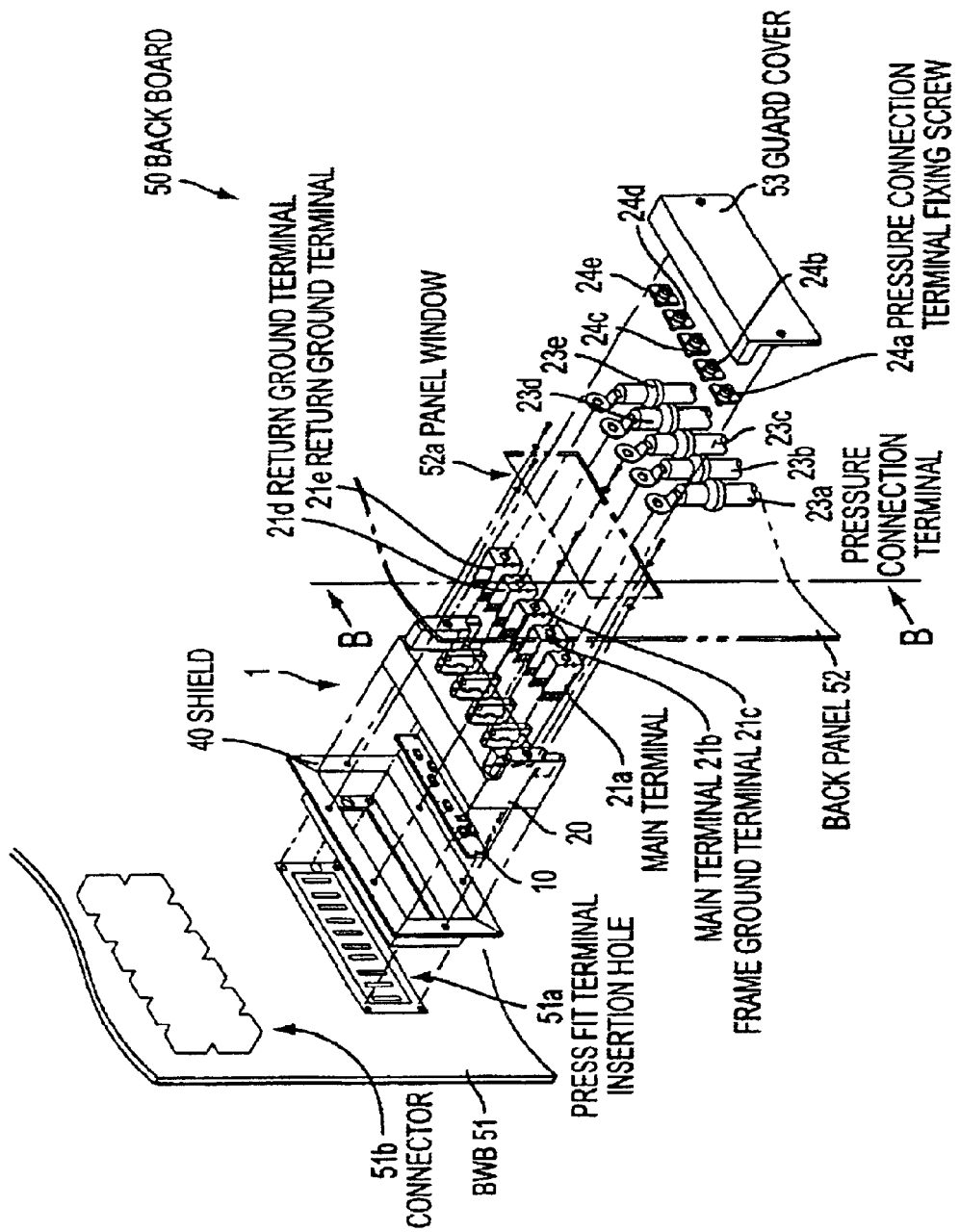
FIG. 3 is a perspective view showing the structure of a back board using a power supply terminal.
Figure 4:
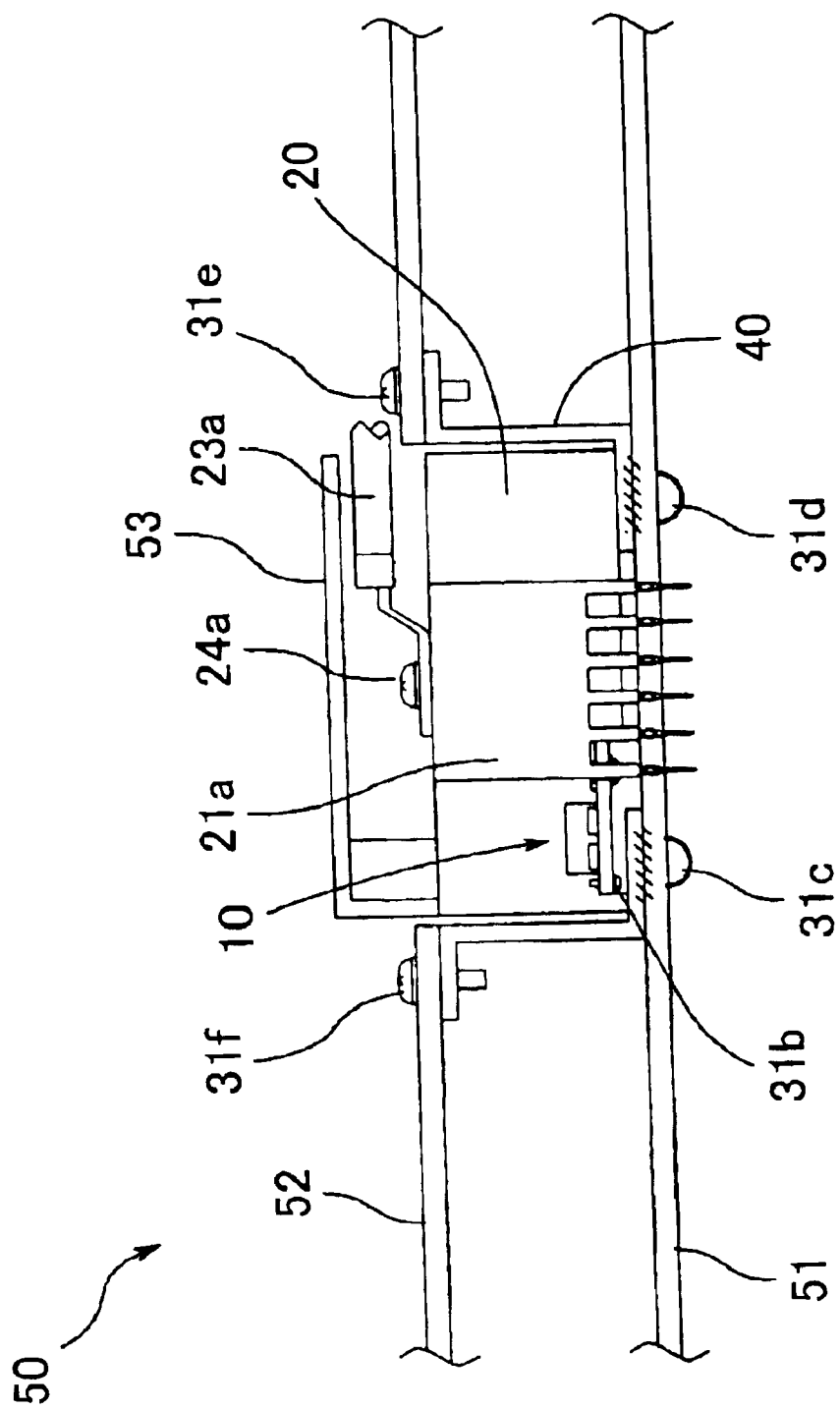
FIG. 4 is a sectional view taken along the line B—B of FIG. 3.

FIG. 3 is a perspective view showing the structure of a back board 50 using the power supply terminal 1 according to the first embodiment. FIG. 4 is a sectional view taken along the line B—B of FIG. 3.

With the back board 50 shown in FIG. 3, the press fit terminals 21 function as main terminals 21a and 21b, an FG (Frame Ground) terminal 21c, and RG (Return Ground) terminals 21d and 21e respectively. Pressure connection terminals 23a through 23e are fixed to the main terminals 21a and 21b, the FG terminal 21c, and the RG terminals 21d and 21e, respectively, with pressure connection terminal fixing screws 24a through 24e respectively. The main terminals 21a and 21b, FG terminal 21c, and RG terminals 21d and 21e to which the pressure connection terminals 23a through 23e have been fixed with the screws in this way are fitted on the terminal body 20 and are soldered to the noise filter circuit substrate 10 located in the circuit substrate housing portion 22 shown in FIG. 1. This is the same with the cases of FIGS. 1 and 2.

The power supply terminal 1 having the above structure is fixed to a BWB 51 with screws 31c and 31d, with the pin portions of the main terminals 21a and 21b, FG terminal 21c, and RG terminals 21d and 21e inserted into press fit terminal insertion holes 51a in the BWB 51 on which connectors 51b have been mounted.

The back board 50 has a shield 40 of a conductor which covers part of the bottom of the terminal body 20 and the sides of the terminal body 20. The power supply terminal 1, together with the shield 40, is fixed to the BWB 51 by the screws 31c and 31d. In this case, there is a portion of the shield 40 covering the bottom of the terminal body 20 between the terminal body 20 and the BWB 51.

A back panel 52 with a panel window 52a, being a window where cables from the pressure connection terminals 23a through 23e are drawn out, is located on the pressure connection terminals 23a through 23e side of the power supply terminal 1. The back panel 52 is fixed by screws 31e and 31f to the surface on the pressure connection terminals 23a through 23e side of the power supply terminal 1 of the shield 40. Moreover, a guard cover 53 for guarding the pressure connection terminals 23a through 23e and the like is located on the pressure connection terminals 23a through 23e side of the power supply terminal 1 and is fixed by screws to the surface on the pressure connection terminals 23a through 23e side of the power supply terminal 1.

Figure 5A:
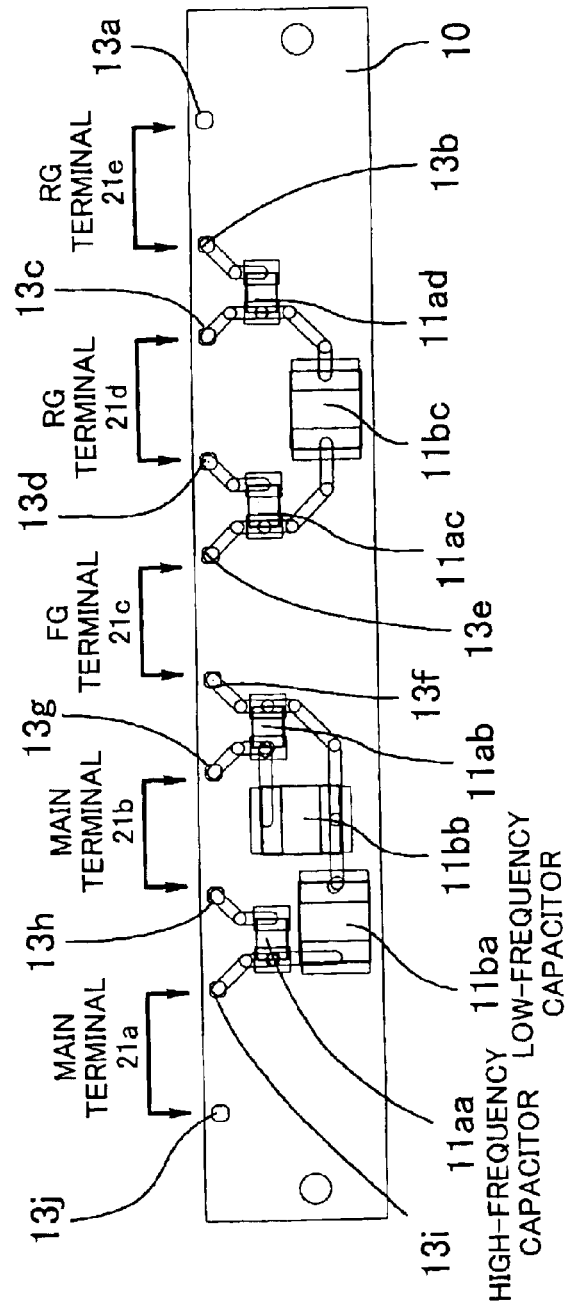
FIGS. 5(A) and 5(B) are views showing the detailed structure of a noise filter circuit substrate, FIG. 5(A) being a plan showing the detailed structure of the noise filter circuit substrate, FIG. 5(B) being a circuit diagram of the noise filter circuit substrate.
Figure 5B:
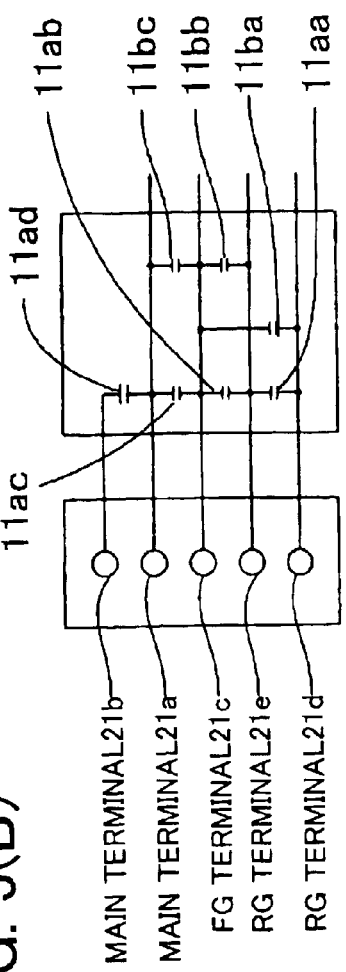

FIGS. 5(A) and 5(B) are views showing the detailed structure of the noise filter circuit substrate 10. FIG. 5(A) is a plan showing the detailed structure of the noise filter circuit substrate 10. FIG. 5(B) is a circuit diagram of the noise filter circuit substrate 10.

As shown in FIG. 5(A), the noise filter circuit on the noise filter circuit substrate 10 includes high-frequency capacitors 11aa through 11ad which resonate at a frequency of about 30 MHz to 100 MHz and low-frequency capacitors 11ba through 11bc which resonate at a frequency of about 300 kHz to 30 MHz. The high-frequency capacitors 11aa through 11ad are located near a main terminal 21a, a main terminal 21b, an FG terminal 21c and an RG terminal 21d, and an RG terminal 21e respectively. As shown in FIG. 5(B), the main terminal 21b is connected to the main terminal 21a via the high-frequency capacitor 11ad and the main terminal 21a is connected to the FG terminal 21c via the high-frequency capacitor 11ac and the low-frequency capacitor 11bc connected in parallel. The RG terminal 21d is connected to the RG terminal 21e via the high-frequency capacitor 11aa and is connected to the FG terminal 21c via the low-frequency capacitor 11ba connected in parallel with the high-frequency capacitor 11aa. The RG terminal 21e is connected to the FG terminal 21c via the high-frequency capacitor 11ab and the low-frequency capacitor 11bb connected in parallel. In this embodiment the FG terminal 21c is located between the main terminals 21a and 21b and the RG terminals 21d and 21e so that the FG terminal 21c will be located near the center of the noise filter circuit. This structure can make both the distance from the main terminal 21a or 21b to the FG terminal 21c and the distance from the RG terminal 21d or 21e to the FG terminal 21c fall within a predetermined range. As a result, noise produced on a wiring pattern from the main terminals 21a and 21b to the FG terminal 21c and a wiring pattern from the RG terminals 21d and 21e to the FG terminal 21c can be minimized.

Figure 6:
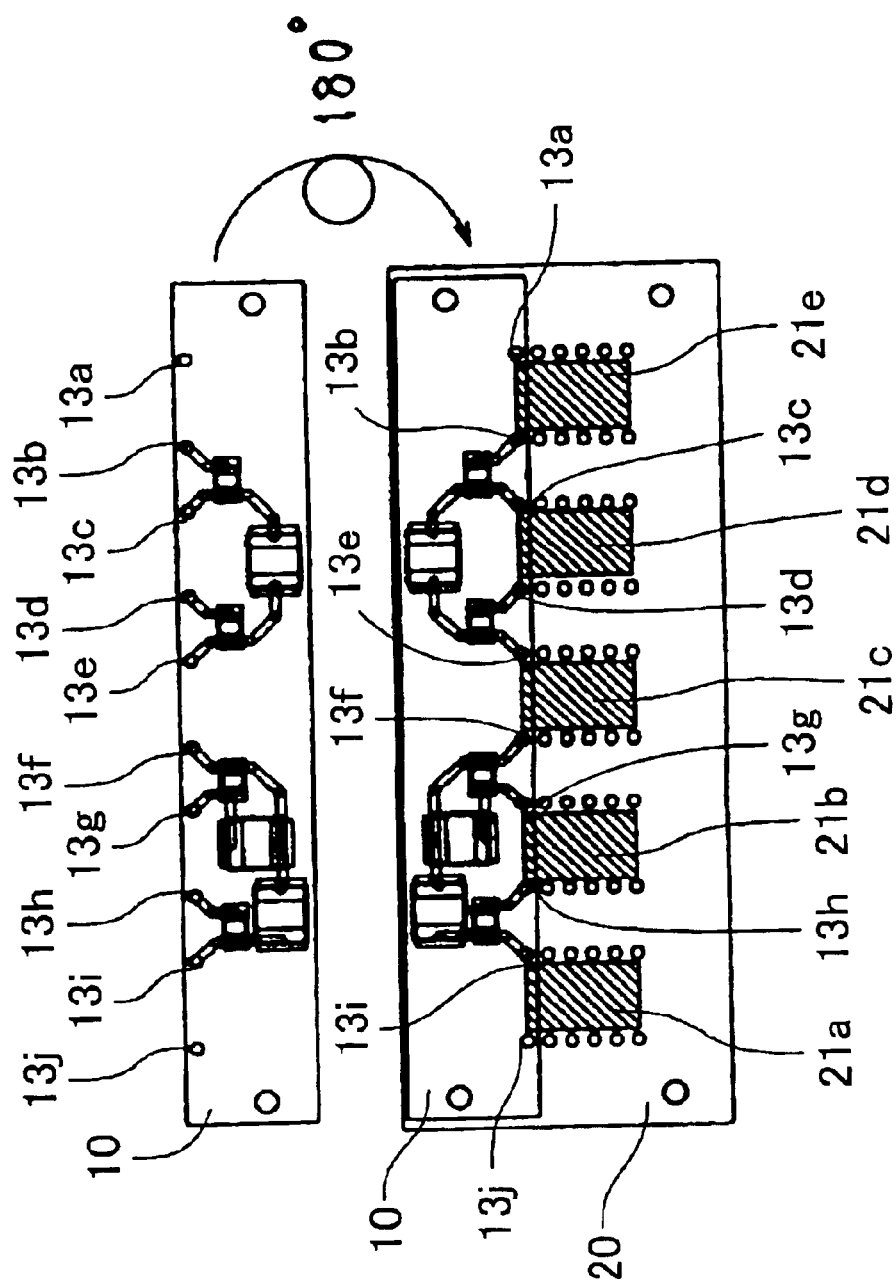
FIG. 6 is a view showing how to fit the noise filter circuit substrate shown in FIG. 5(A) on a terminal body.

FIG. 6 is a view showing how to fit the noise filter circuit substrate 10 shown in FIG. 5(A) on the terminal body 20. As shown in FIG. 6, the noise filter circuit substrate 10 is fitted on the terminal body 20 so that the surface on which capacitors included in the noise filter circuit are mounted will face towards the inside of the terminal body 20. In this case, the main terminals 21a and 21b, the FG terminal 21c, and the RG terminals 21d and 21e are inserted into terminal insertion holes 13i and 13j, 13g and 13h, 13e and 13f, 13c and 13d, and 13a and 13b respectively and are soldered there. As a result, the main terminals 21a and 21b, the FG terminal 21c, and the RG terminals 21d and 21e are connected conductively to the noise filter circuit substrate 10.

As stated above, in this embodiment the noise filter circuit is formed on the noise filter circuit substrate 10, being a substrate separate from the BWB. This can prevent the BWB's warp from damaging the capacitors included in the noise filter circuit.

Moreover, the noise filter circuit is formed on the noise filter circuit substrate 10, so the capacitors included in the noise filter circuit can be mounted by reflow soldering. This can prevent damage to the capacitors included in the noise filter circuit which may occur due to thermal stresses caused by manual soldering.

Furthermore, the noise filter circuit is formed on the noise filter circuit substrate 10, so the capacitors included in the noise filter circuit can be mounted by reflow soldering. As a result, the capacitors can be located near the press fit terminals 21 and high-frequency capacitors can be used in the noise filter circuit.

In addition, the noise filter circuit is formed on the noise filter circuit substrate 10 and the noise filter circuit substrate 10 is located inside the circuit substrate housing portion 22. As a result, the shield 40 can be fixed by screws to the terminal body 20 even at a place where the noise filter circuit substrate 10, being the noise filter circuit, is located. The shield 40 therefore can be located near the press fit terminals.

Now, a second embodiment of the present invention will be described.

This embodiment is a modification of the first embodiment and differs from the first embodiment in that a noise filter circuit substrate which includes a noise filter circuit is fitted on a BWB. Descriptions will be given with stress laid on the differences between the first and second embodiments and descriptions of the other particulars will be omitted.

Figure 7A:
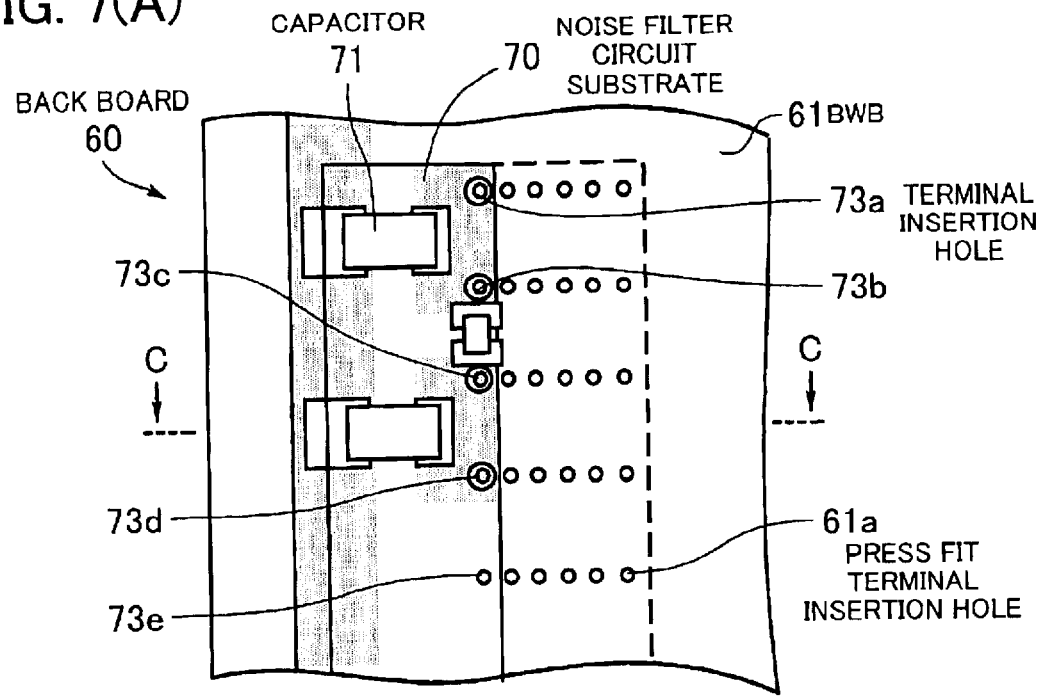
FIGS. 7(A), 7(B), and 7(C) are views showing the structure of a back board on which a power supply terminal is fitted, FIG. 7(A) being a plan showing a BWB on which a noise filter circuit substrate has been fitted, FIG. 7(B) being a sectional view taken along the line C—C of FIG. 7(A), and FIG. 7(C) being a sectional view taken along the line C—C of FIG. 7(A) in the case of press fit terminals 81 having been inserted into the BWB.
Figure 7B:
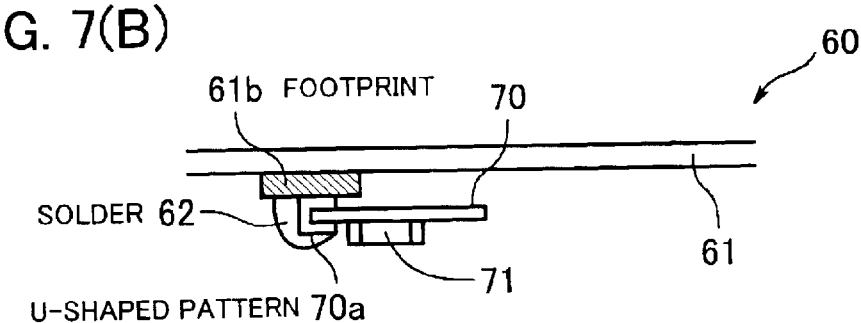
Figure 7C:
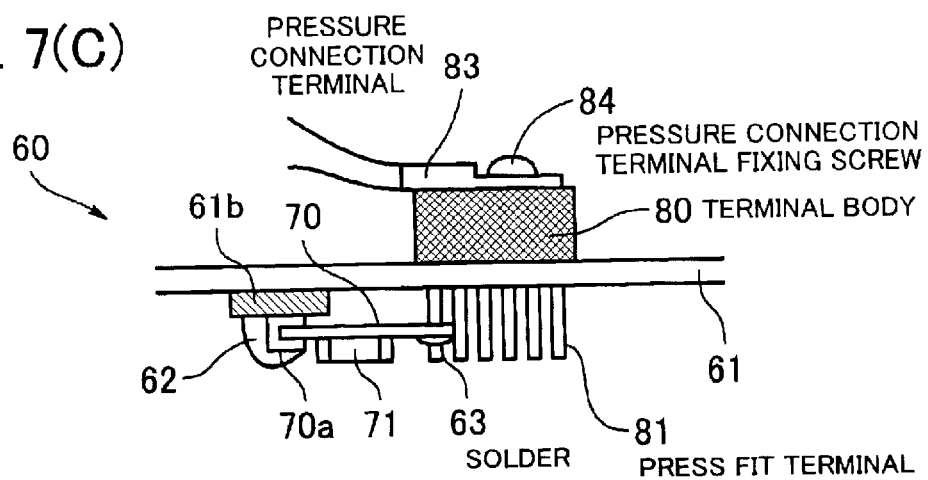

FIGS. 7(A), 7(B), and 7(C) are views showing the structure of a back board 60 on which a power supply terminal according to this embodiment is fitted. FIG. 7(A) is a plan showing a BWB 61 on which a noise filter circuit substrate 70 has been fitted. FIG. 7(B) is a sectional view taken along the line C—C of FIG. 7(A). FIG. 7(C) is a sectional view taken along the line C—C of FIG. 7(A) in the case of press fit terminals 81 having been inserted into the BWB 61.

As shown in FIG. 7(A), a plurality of capacitors 71 included in a noise filter circuit are mounted on the noise filter circuit substrate 70 and terminal insertion holes 73a through 73e into which the press fit terminals are inserted are made at the edge portion along one long side of the noise filter circuit substrate 70. This is the same with the first embodiment. U-shaped patterns 70a of a conductor are located at the edge portion along the other long side of the noise filter circuit substrate 70. Each U-shaped pattern 70a is formed so that it will conductively connect the top, side, and bottom of the edge portion along the other long side of the noise filter circuit substrate 70. As a result, a section of each U-shaped pattern 70a assumes a U shape as shown in FIG. 7(B).

As shown in FIGS. 7(B) and 7(C), footprints 61b of a conductor are located on the BWB 61. The noise filter circuit substrate 70 is located almost parallel to the BWB 61 with the surface on which the capacitors 71 are mounted faced towards the outside. The U-shaped patterns 70a are soldered to the footprints 61b with solder 62, so the noise filter circuit substrate 70 is fixed to the BWB 61.

As shown in FIG. 7(C), the press fit terminals 81 are inserted into press fit terminal insertion holes 61a made in the BWB 61 to which the noise filter circuit substrate 70 is fixed in this way from the surface on which the noise filter circuit substrate 70 is not located. The press fit terminals 81 inserted into the press fit terminal insertion holes 61a in this way are also inserted into the terminal insertion holes 73a through 73e made in the noise filter circuit substrate 70. The press fit terminals 81 inserted into the terminal insertion holes 73a through 73e are connected conductively to the terminal insertion holes 73a through 73e with solder 63. As a result, the press fit terminals 81 are connected to the noise filter circuit substrate 70.

Figure 8:
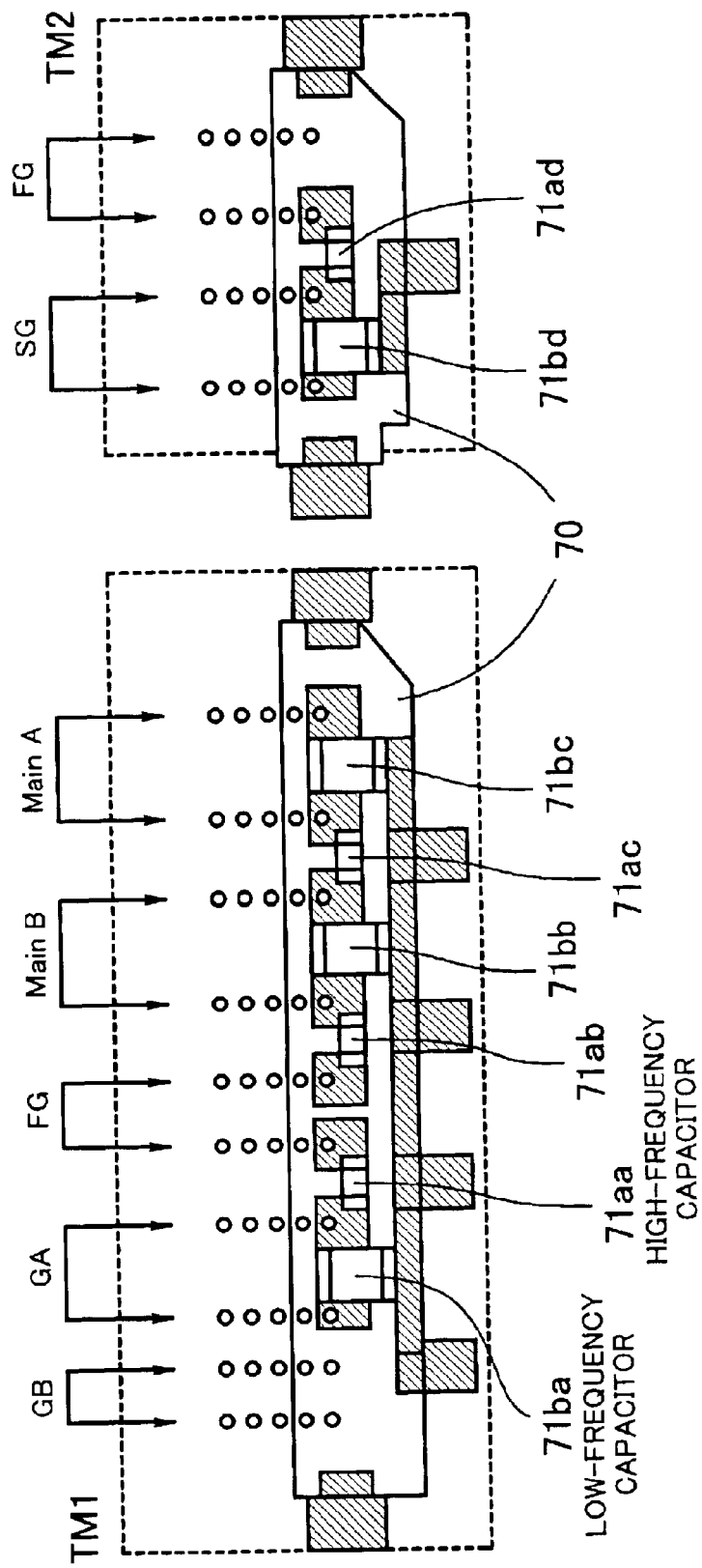
FIG. 8 is a plan showing the detailed structure of a noise filter circuit substrate.
Figure 9:
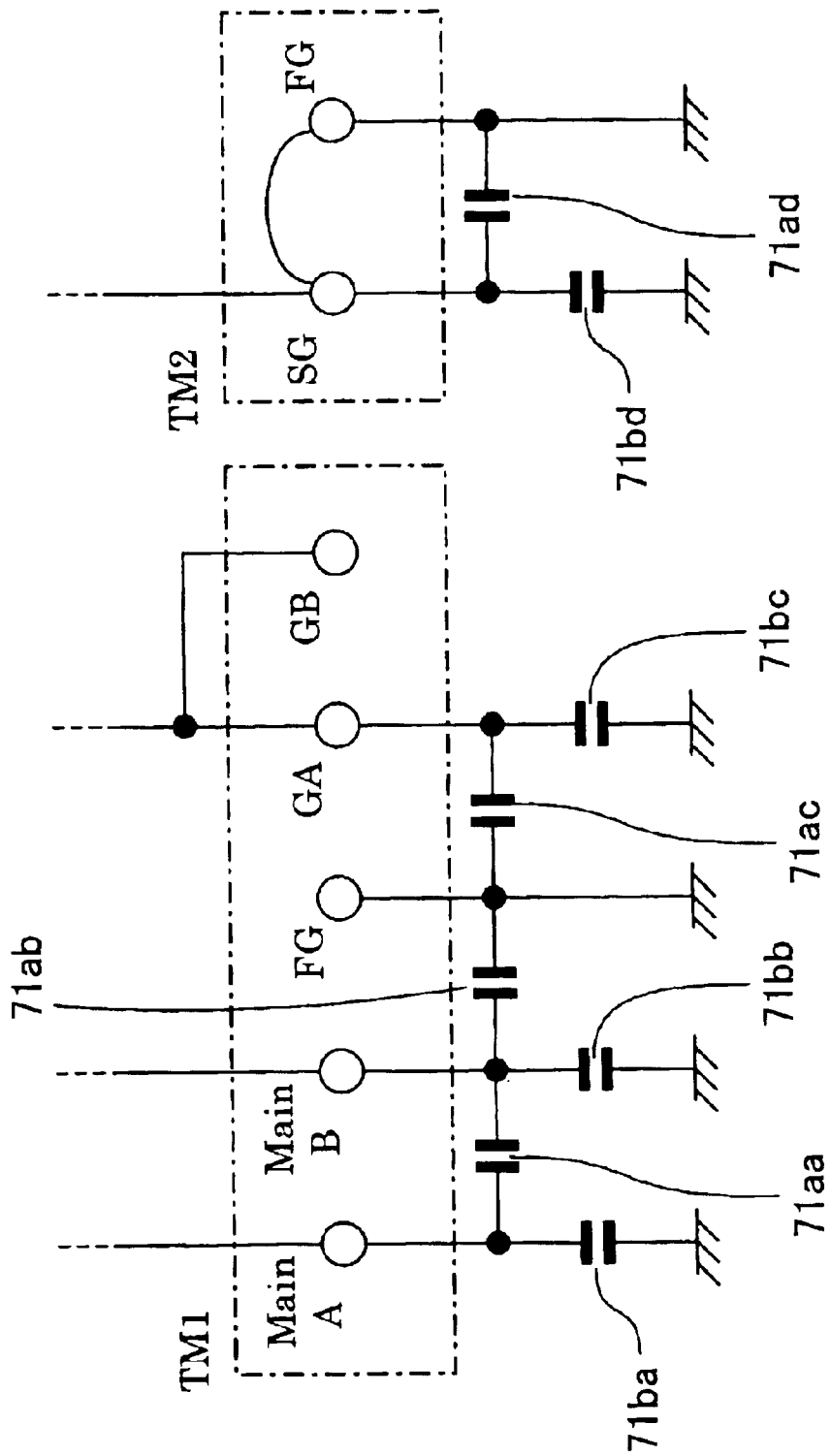
FIG. 9 is a circuit diagram showing the detailed structure of the noise filter circuit substrate.
Figure 10:
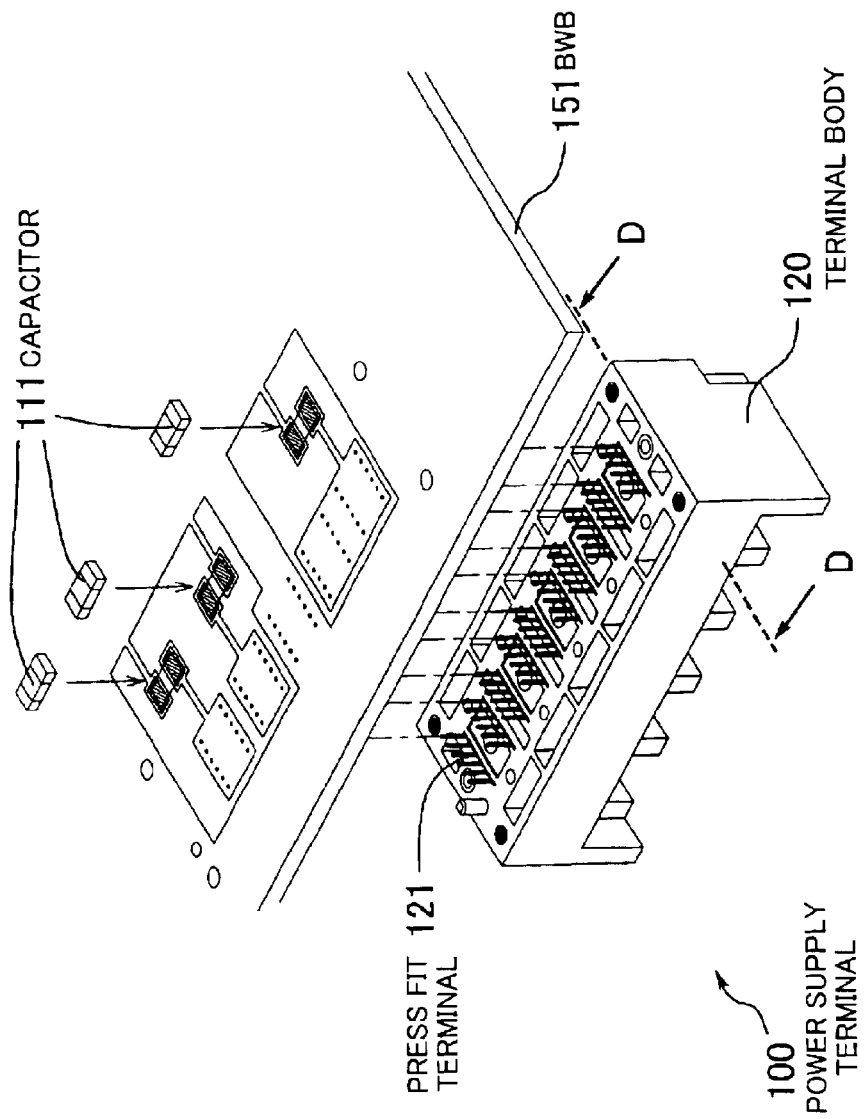
FIG. 10 is a perspective view showing a conventional structure in which power supply is connected to a BWB by the use of a power supply terminal with press fit terminals.
Figure 11:
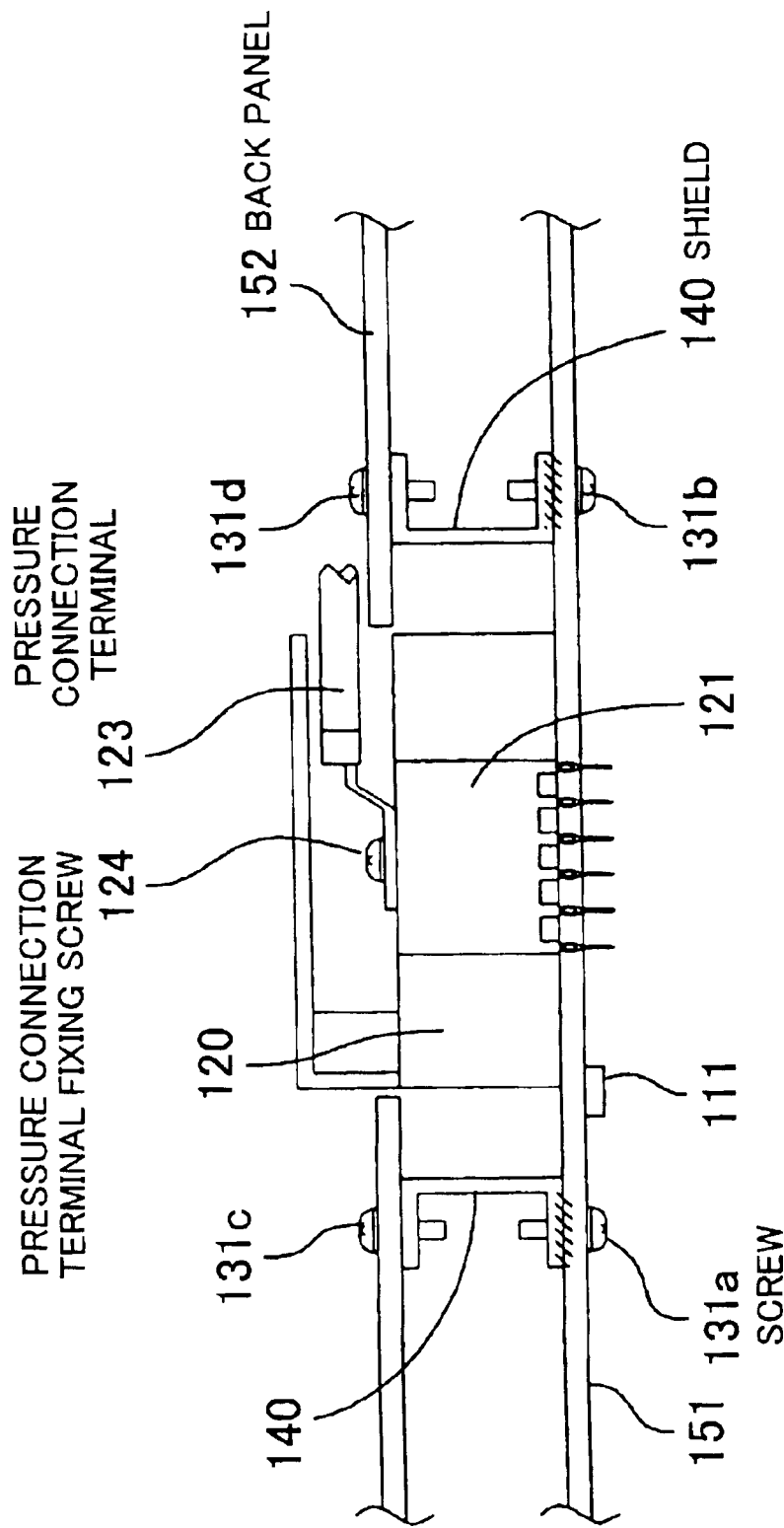
FIG. 11 is a sectional view taken along the line D—D of FIG. 10.

FIG. 8 is a plan showing the detailed structure of the noise filter circuit substrate 70. FIG. 9 is a circuit diagram showing the detailed structure of the noise filter circuit substrate 70.

As shown in FIGS. 8 and 9, the noise filter circuit on the noise filter circuit substrate 70 includes high-frequency capacitors 71aa through 71ad and low-frequency capacitors 71ba through 71bd. The high-frequency capacitors 71aa through 71ad are located near an FG terminal, main terminals (Main B, Main A), and an SG terminal respectively. As shown in FIG. 9, the noise filter circuit substrate 70 in this embodiment is connected to two terminals (TM1 and TM2). In TM1 main terminal A is grounded via the low-frequency capacitor 71ba and is connected to main terminal B via the high-frequency capacitor 71aa. The main terminal B is grounded via the low-frequency capacitor 71bb. Moreover, the main terminal B is connected to an FG terminal and is grounded, via the high-frequency capacitor 71ab. A GA terminal is grounded via the low-frequency capacitor 71bc and is connected to the FG terminal via the high-frequency capacitor 71ac. In TM2 the SG terminal is grounded via the low-frequency capacitor 71bd. Moreover, the SG terminal is connected to an FG terminal and is grounded, via the high-frequency capacitor 71ad.

As stated above, the same effect that is obtained in the first embodiment can be achieved by adopting the structure in which the noise filter circuit substrate 70 is fixed to the BWB 61.

As has been described in the foregoing, in the present invention a noise filter circuit is formed on a noise filter circuit substrate, being a substrate separate from a BWB. This can prevent the BWB's warp from damaging capacitors included in the noise filter circuit.

Moreover, a noise filter circuit is formed on a noise filter circuit substrate, so capacitors included in the noise filter circuit can be mounted by reflow soldering. This can prevent damage to the capacitors included in the noise filter circuit which may occur due to thermal stresses caused by manual soldering.

Furthermore, a noise filter circuit is formed on a noise filter circuit substrate, so capacitors included in the noise filter circuit can be mounted by reflow soldering. As a result, the capacitors can be located near press fit terminals and high-frequency capacitors can be used in the noise filter circuit.

In addition, a noise filter circuit is formed on a noise filter circuit substrate. As a result, a shield can be fixed by screws to a terminal body even at a place where the noise filter circuit substrate, being the noise filter circuit, is located. The shield therefore can be located near press fit terminals.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A power supply terminal for supplying power to a back wiring board, the terminal comprising:

a terminal body as a base;

press fit terminals at least part of each of which is housed in the terminal body and which are electrically connected to the back wiring board by being inserted into the back wiring board;

a noise filter circuit substrate which is separate from the back wiring board and on which capacitors included in a noise filter circuit electrically connected to the press fit terminals are mounted; and a frame ground terminal of the noise filter circuit is located near the center of the noise filter circuit.

2. The power supply terminal according to claim 1, wherein the noise filter circuit substrate is soldered directly to the press fit terminals which have been inserted into the back wiring board.

3. The power supply terminal according to claim 1, wherein the capacitors are mounted on the noise filter circuit substrate by reflow soldering.

4. The power supply terminal according to claim 1, wherein the capacitors included in the noise filter circuit resonate at frequencies higher than or equal to 30 MHz.

5. The power supply terminal according to claim 1, wherein the terminal body includes a circuit substrate housing portion, being a slot, for housing the noise filter circuit substrate, further wherein the noise filter circuit substrate is located by being housed in the circuit substrate housing portion.

6. A back board for supplying power, the board comprising:

a back wiring board on which a pattern for supplying power is formed;

a power supply terminal including:
   a terminal body as a base, and
   press fit terminals at least part of each of which is housed in the terminal body and which are electrically connected to the back wiring board by being inserted into the back wiring board; and a noise filter circuit substrate which is separate from the back wiring board and on which capacitors included in a noise filter circuit electrically connected to the press fit terminals are mounted, wherein the noise filter circuit substrate is fitted on a surface of the back wiring board reverse to a surface on which the terminal body is located.

7. The back board according to claim 6, further comprising a shield that covers at least part of the bottom of the terminal body.

8. The back board according to claim 7, wherein portions of an area of the shield situated on the bottom side of the terminal body, the back wiring board, and the terminal body are fixed by a same screw.

9. The back board according to claim 6, wherein the noise filter circuit substrate is soldered directly to the press fit terminals which have been inserted into the back wiring board.

10. The back board according to claim 6, wherein the capacitors are mounted on the noise filter circuit substrate by reflow soldering.

11. The back board according to claim 6, wherein the capacitors included in the noise filter circuit resonate at frequencies higher than or equal to 30 MHz.

12. The back board according to claim 6, wherein the terminal body includes a circuit substrate housing portion, being a slot, for housing the noise filter circuit substrate, further wherein the noise filter circuit substrate is located by being housed in the circuit substrate housing portion.

13. The back board according to claim 6, wherein a frame ground terminal of the noise filter circuit is located near the center of the noise filter circuit.

* * * * *

UNITED STATES PATENT AND TRADEMARK OFFICE
CERTIFICATE OF CORRECTION

PATENT NO. : 6,807,066 B2
DATED : October 19, 2004
INVENTOR(S) : J. Hayama et al.

It is certified that error appears in the above-identified patent and that said Letters Patent is hereby corrected as shown below:

Title page,
Item [75], Inventors, should read:
-- Junichi Hayama, Kawasaki (JP);
   Noboru Nakama, Kawasaki (JP);
   Tetsuya Murayama, Kawasaki (JP);
   Kenji Tsutsumi, Kawasaki (JP);
   Satoshi Tojo, Osaka (JP); Hiroshi Kadoya, Kawasaki (JP); Kiyonori Kusuda, Kawasaki (JP); Kenji Toshimitsu, Kawasaki (JP) --.

Signed and Sealed this

Twenty-second Day of November, 2005

JON W. DUDAS
*Director of the United States Patent and Trademark Office*